US012660648B2

(12) United States Patent
Han et al.

(10) Patent No.: US 12,660,648 B2
(45) Date of Patent: Jun. 16, 2026

(54) EMBEDDED GLASS CORES IN PACKAGE SUBSTRATES AND RELATED METHODS

(71) Applicant: Intel Corporation, Santa Clara, CA (US)

(72) Inventors: Jung Kyu Han, Chandler, AZ (US); Jiwei Sun, Chandler, AZ (US); Zhiguo Qian, Chandler, AZ (US); Srinivas Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 258 days.

(21) Appl. No.: 17/483,444

(22) Filed: Sep. 23, 2021

(65) Prior Publication Data

US 2023/0088928 A1     Mar. 23, 2023

(51) Int. Cl.
| | |
|---|---|
| *H10W 70/63* | (2026.01) |
| *H10D 1/20* | (2025.01) |
| *H10W 70/05* | (2026.01) |
| *H10W 70/65* | (2026.01) |
| *H10W 70/66* | (2026.01) |
| *H10W 70/685* | (2026.01) |
| *H10W 70/692* | (2026.01) |
| *H10W 90/00* | (2026.01) |

(52) U.S. Cl.
CPC ............ *H10W 70/635* (2026.01); *H10D 1/20* (2025.01); *H10W 70/05* (2026.01); *H10W 70/095* (2026.01); *H10W 70/65* (2026.01); *H10W 70/66* (2026.01); *H10W 70/685* (2026.01); *H10W 70/692* (2026.01); *H10W 90/724* (2026.01)

(58) Field of Classification Search
CPC ......... H01L 23/49866; H01L 23/49838; H01L 23/49827; H01L 23/49822; H01L 23/15; H10W 70/635; H10W 70/685; H10W 70/70; H10W 70/095; H10W 70/65; H10W 70/05; H10W 70/692; H10W 70/66
See application file for complete search history.

(56) References Cited

U.S. PATENT DOCUMENTS

| | | | | |
|---|---|---|---|---|
| 10,115,671 | B2 * | 10/2018 | Shenoy | ................ H01L 25/105 |
| 11,393,751 | B2 * | 7/2022 | Do | .................... H01L 23/49822 |
| 2013/0056847 | A1 * | 3/2013 | Chen | .................. H01L 23/5227 |
| | | | | 257/E29.325 |
| 2014/0217546 | A1 * | 8/2014 | Yen | ......................... H01L 24/05 |
| | | | | 438/381 |
| 2017/0135203 | A1 * | 5/2017 | Shen | ................ H01L 23/49822 |
| 2020/0051749 | A1 * | 2/2020 | Suemasa | ............... H10D 1/696 |
| 2020/0066627 | A1 * | 2/2020 | Do | .................... H01L 23/49838 |
| 2020/0066634 | A1 * | 2/2020 | Do | ...................... H01L 21/4857 |
| 2020/0066830 | A1 * | 2/2020 | Bharath | ............... H01L 23/645 |
| 2020/0275558 | A1 * | 8/2020 | Fujita | ................. H01L 21/4857 |

(Continued)

*Primary Examiner* — Nathan W Ha
(74) *Attorney, Agent, or Firm* — Hanley, Flight & Zimmerman, LLC

(57) ABSTRACT

Embedded glass cores in package substrates and related methods are disclosed herein including an integrated circuit including a substrate having a first side and a second side opposite the first side, a plurality of vias disposed within the substrate to electrically couple corresponding contacts on the first and second sides of the substrate, a glass core surrounding a first via of the plurality of vias, and an organic core surrounding a second via of the plurality of vias, the second via different than the first via.

23 Claims, 13 Drawing Sheets

(56)                 References Cited

U.S. PATENT DOCUMENTS

2023/0085411 A1 *   3/2023  Paital ...................... H01L 25/18
                                                          257/621
2023/0091666 A1 *   3/2023  Duong ................. H05K 1/0298
                                                          174/260
2025/0279346 A1 *   9/2025  Kim ........................ H01L 24/08

* cited by examiner

EMBEDDED GLASS CORES IN PACKAGE SUBSTRATES AND RELATED METHODS

FIELD OF THE DISCLOSURE

This disclosure relates generally to integrated circuit packages and, more particularly, to embedded glass cores in package substrates and related methods.

BACKGROUND

In recent years, the use of integrated circuits (IC) within electrical devices has increased across a wide range of applications such as computers, mobile devices, and other digital appliances. ICs present a number of advantages such as low cost of manufacturing and fabrication as well as high performance thresholds with minimal power consumption.

Figure 1:
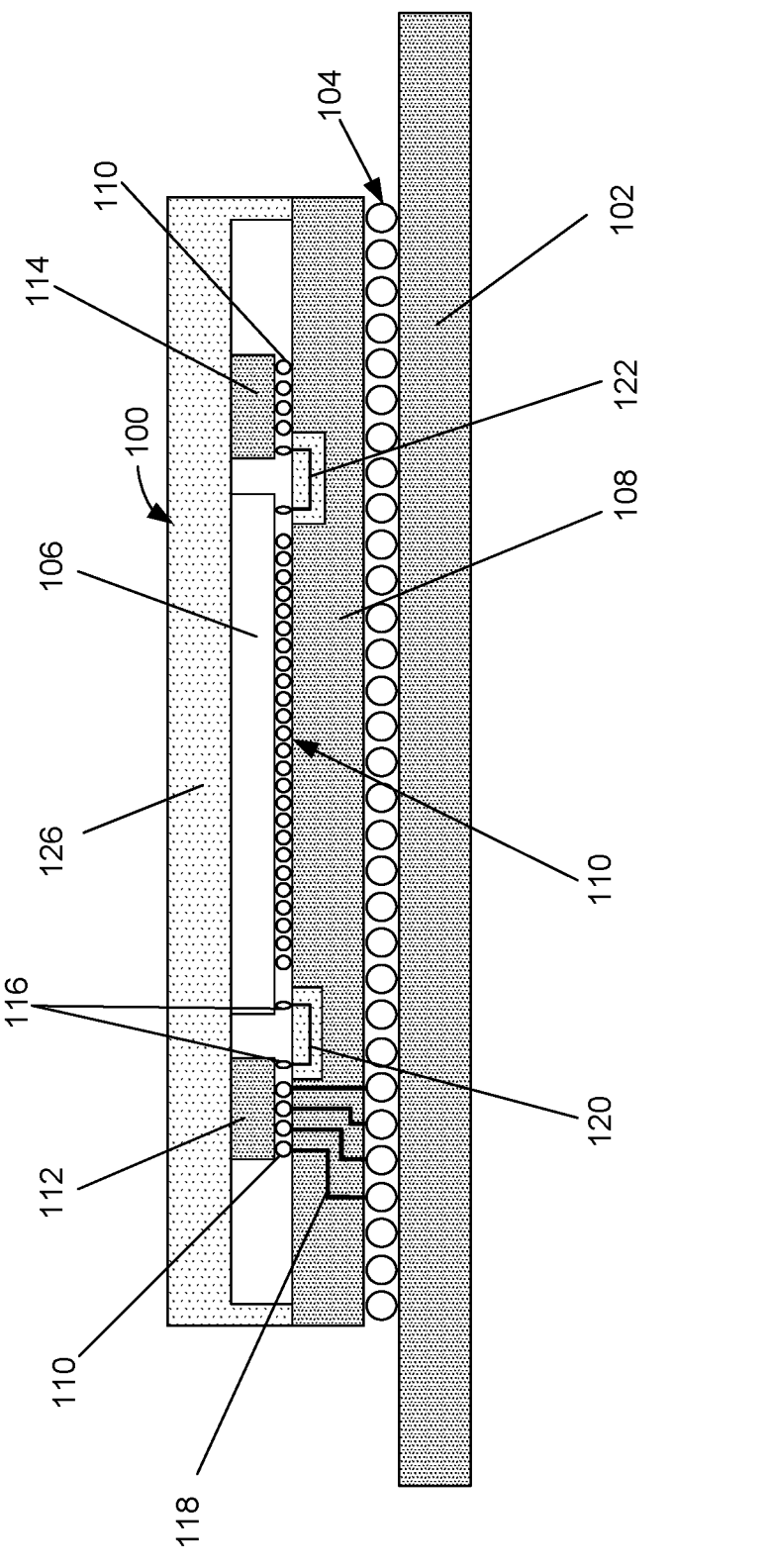
FIG. 1 illustrates an example integrated circuit (IC) package that includes three example semiconductor dies electrically coupled to a package substrate that is electrically coupled to a circuit board.

The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

As the demands for integrated circuit (IC) packages evolve and require an increasing number of functions and speed capabilities, developments in IC package substrate design and fabrication have aimed to improve power delivery, increase performance bandwidth, and facilitate faster high-speed input/output (HSIO) communication. Low loss dielectrics and low roughness copper traces are two features that can be utilized within substrates of IC packages for HSIO applications and improvements. In addition to such features, as disclosed herein, embedded glass core(s) including one or more plated through holes (PTHs) or vias can provide additional reductions in signal loss and also enable higher speeds. In examples disclosed herein, embedded glass core(s) enable the implementation of smaller drill dimensions for creating the through holes or vias within a package substrate as well as smaller pad dimensions for the vias on the substrate surface(s). As such, the use of glass cores within the substrate improves impedance matching across the core region of the substrate and, in some examples, can reduce insertion loss from –0.98 dB to –0.56 dB at the Nyquist frequency, a 43% reduction compared to currently implemented organic core material substrates, and increases the HSIO bandwidth.

Consequently, the use of embedded glass cores enables larger balls within a ball grid array with a same insertion loss compared to currently implemented organic material cores. Thus, a surface mount of the package substrate and/or a patch-interposer assembly is more feasible.

Although the implementation of embedded glass cores in examples disclosed herein present the aforementioned improvements and advantages, glass cores do have limitations in manufacturing, handling, cutting, as well as compatibility with traditional semi-additive processes due to the thickness of glass cores, for example. Furthermore, it is difficult to implement a coaxial magnetic inductor layer (used for power delivery) in a glass core. However, examples disclosed herein combine the use of glass cores with organic cores in different regions of a substrate to take advantage of the benefits of glass cores while mitigating against their limitations. More particularly, glass cores embedded within organic cores as disclosed herein enable the insertion of coaxial magnetic inductors within the organic core region of the substrate to facilitate improved power delivery while also enabling the insertion of densely arranged vias in the glass core region of the substrate to facilitate faster HSIO. This hybrid approach is a viable solution to the above noted problems because not all PTHs carry HSIO signals. That is, examples disclosed herein enable specific routing areas within a substrate associated with HSIO to pass through an embedded glass core region while the organic core regions are also included to achieve the established power delivery benefits of such organic materials. Furthermore, the implementation of glass cores in combination with organic material core(s) enables simplified package handling with traditional semi-additive processing and handling, including slicing and/or cutting processes. Further, combining glass cores with organic cores generally provides greater flexibility in package design.

FIG. 1 illustrates a cross-sectional view of an example integrated circuit (IC) package 100. The IC package 100 is electrically coupled to an example circuit board 102 (e.g., a printed circuit board (PCB)) by an array of solder bumps or balls 104 forming a ball grid array. In other examples, the IC package 100 includes pins and/or pads, in addition to or instead of the balls 104, to facilitate electrical coupling of the package 100 to the circuit board 102. As shown in FIG. 1, the package 100 includes a first example semiconductor (e.g. silicon) die 106 that is mounted to a package substrate 108 via an array of core bumps (e.g., solder balls) 110. In this example, the package 100 includes second and third semiconductor (e.g., silicon) dies 112, 114 that are mounted to the package substrate 108. As shown in FIG. 1, the second die 112 is located on a first side (e.g., left as shown in the figure) of the first semiconductor die 106 and the third die 114 is located on an opposite side (e.g., right as shown in the figure) of the first semiconductor die 106 relative to the second die 112. In other examples, the IC package 100 may have only one die, only two dies, or more than three dies in alternate locations mounted on the package substrate 108.

As shown in FIG. 1, similar to the first semiconductor die 106, each of the second and third dies 112, 114 is electrically and mechanically coupled to the package substrate 108 via corresponding arrays of core bumps 110. The electrical connections (e.g., the core bumps 110) between the first, second, and third dies 106, 112, 114 and the package substrate 108 are commonly referred to as first level interconnects. Further, the electrical connections between the IC package 108 and the circuit board 102 (e.g., the balls 104) are referred to as second level interconnects. In some examples, one or more of the first, second, and third dies 106, 112, 114 may be mounted or stacked on top of one or more other dies. In such examples, the first, second, and third dies 106, 112, 114 are coupled to the underlying one or more dies via a first set of first level interconnects and the underlying die may be connected to the package substrate 108 via a second (separate) set of first level interconnects associated with the underlying die. Thus, as used herein, first level interconnects refer to bumps between a die and a package substrate or a die and an underlying die, regardless of the number of dies stacked on one another.

As shown in FIG. 1, the bumps 110 of the first level interconnects connecting the dies 106, 112, 114 to the package substrate 108 include two different types of bumps corresponding to the set of core bumps 110 and a set of bridge bumps 116. In examples disclosed herein, the set of core bumps 110 refers to bumps on the dies 106, 112, 114 through which electrical signals pass between the dies 106, 112, 114 and components external to the IC package 100. For example, as shown in FIG. 1, the core bumps 110 physically connected between the dies 106, 112, 114 and the package substrate 108 are electrically coupled to the second level interconnect or balls 104 located between the package substrate 108 and the circuit board 102 via a set of internal traces or interconnects 118 (only some of which are shown) within the package substrate 108. In examples disclosed herein, the set of bridge bumps 116 refers to bumps on the dies 106, 112, 114 through which electrical signals pass between different ones of the dies 106, 112, 114. More particularly, in this example, the bridge bumps 116 on the second and third dies 112, 114 are electrically coupled to corresponding bridge bumps 116 of the first die 106 via respective first and second interconnect bridges 120, 122 (e.g., embedded multi-die interconnect bridges (EMIBs)) embedded in the package substrate 108. In some examples, individual ones of core bumps 110 are typically larger than individual ones of the bridge bumps 116. As shown by FIG. 1, the dies 106, 112, 114 are enclosed by a package lid or mold compound 126.

Figure 2:
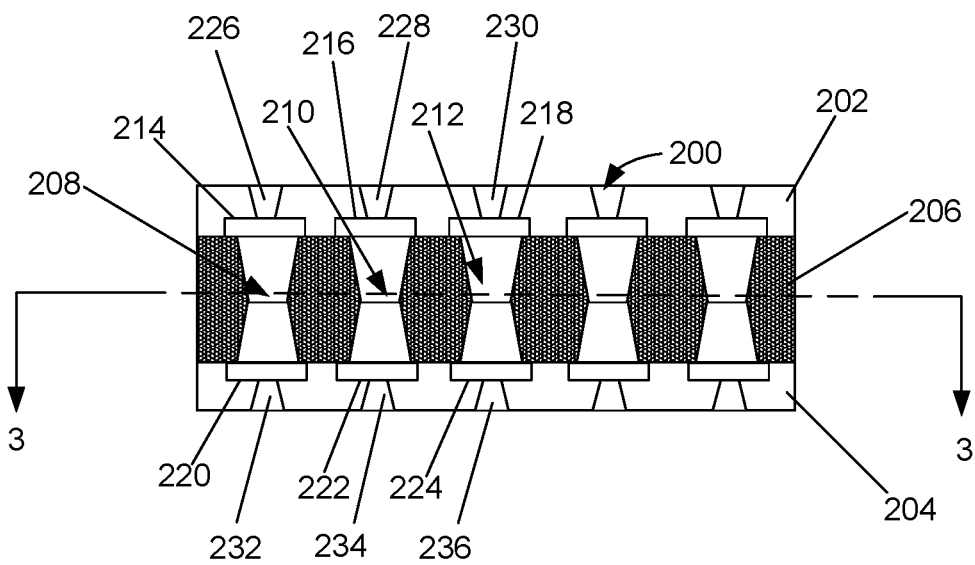
FIG. 2 illustrates a cross-sectional side-view of a substrate commonly implemented as a package substrate in an IC package, such as the IC package shown in FIG. 1.
Figure 3:
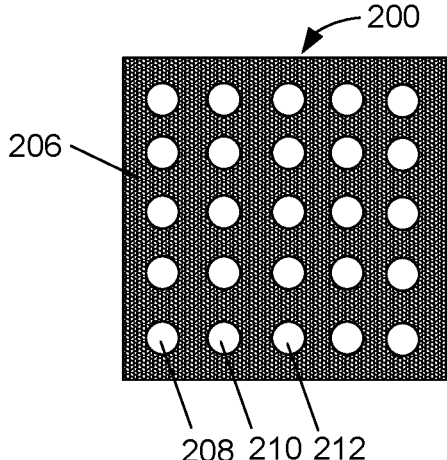
FIG. 3 illustrates a cutaway top-view of the substrate of FIG. 2 taken along the 3-3 line shown in FIG. 2.

FIG. 2 illustrates a cross-sectional view of a substrate 200 commonly implemented as a package substrate in an IC package, such as the IC package 100 shown in FIG. 1. FIG. 3 illustrates a cutaway top view of substrate 200 of FIG. 2 taken along the 2-2 line of FIG. 2. Additionally, or alternatively, the substrate 200 may be implemented on a circuit substrate (e.g., a printed circuit board (PCB)). From the foregoing, it is understood that the substrate 200 of FIG. 2 is constructed using known and currently implemented techniques. As shown by FIG. 2, the substrate 200 includes a top layer (e.g., a first build-up layer) 202 and a bottom layer (e.g., a second build-up layer) 204. In some instances, if the substrate 200 is implemented as a package substrate, each of the top and bottom layers 202, 204 are made of a resin coated copper, or a set of layered build-up films, and may include a solder mask. In other instances, where the substrate 200 is implemented as a circuit substrate in a PCB, the top and bottom layers 202, 204 consist of thin layers of copper foil. As shown in FIG. 2, the substrate 200 includes a core 206 disposed between the top layer 202 and bottom layer 204. The core 206 is typically constructed of an organic dielectric material such as bismaleimide triazine (BT) epoxy resin, for example, or a thin layer of laminate material. In some instances, the substrate 200 includes a set of through holes filled with conductive material (e.g., copper) to form vias 208, 210, 212 which are disposed within the core and extend through the core 206 between the top layer 202 and the bottom layer 204 of the substrate 200. The through holes for the vias 208, 210, 212 are commonly drilled or laser cut through the layers of the core and/or other dielectric materials of the substrate 200 and subsequently filled with the conductive material used for the vias 208, 210, 221.

As shown in FIG. 2, each via 208, 210, 212 is electrically coupled to a first contact pad 214, 216, 218 at the top side of the core 206 and second contact pad 220, 222, 224 at the bottom side of the core 206. The contact pads 214, 216, 218, 220, 222, 224 are constructed of a conductive material (e.g., copper) and are surrounded or encapsulated by the corresponding top and bottom layers 202, 204 of the substrate 200. Further, as shown in FIG. 2, smaller conductive vias 226, 228, 230, 232, 234, and 236 extending through the top and bottom layers 202, 204 of the substrate 200 to the contact pads 214, 216, 128, 220, 222, 224, thereby providing a conductive path extending the entire way through the substrate 200.

In some instances, instead of forming vias 208, 210, 221 by completely filling the associated through holes, the interior walls of the holes may be plated with a conductive material such as copper to facilitate electrical conductivity while still providing an open conduit through the hole and are thus referred to as plated through holes. In some instances, the plated through holes or vias 208, 210, 212 have a diameter of approximately 0.45 mm but can vary across applications and use cases of the substrate 200. Although FIG. 2 shows a first row of vias within the substrate 200, it is understood that one or more additional rows of vias may be placed adjacent the first row as is shown in FIG. 3.

Figure 4:
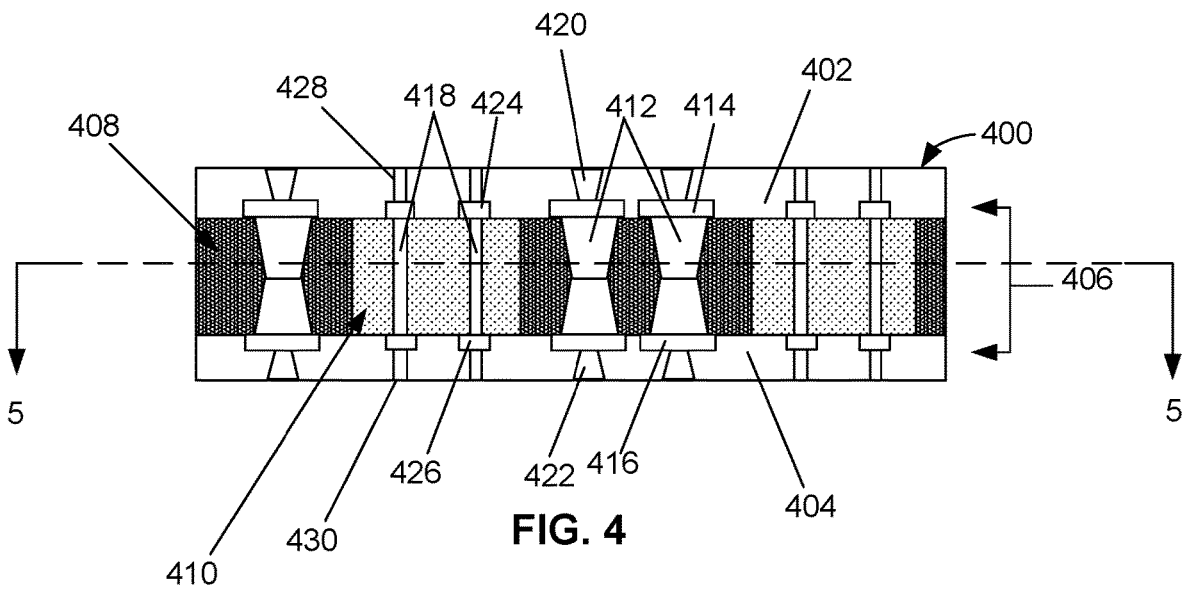
FIG. 4 illustrates a cross-sectional side-view of a first example substrate constructed in accordance with teachings disclosed herein.
Figure 5:
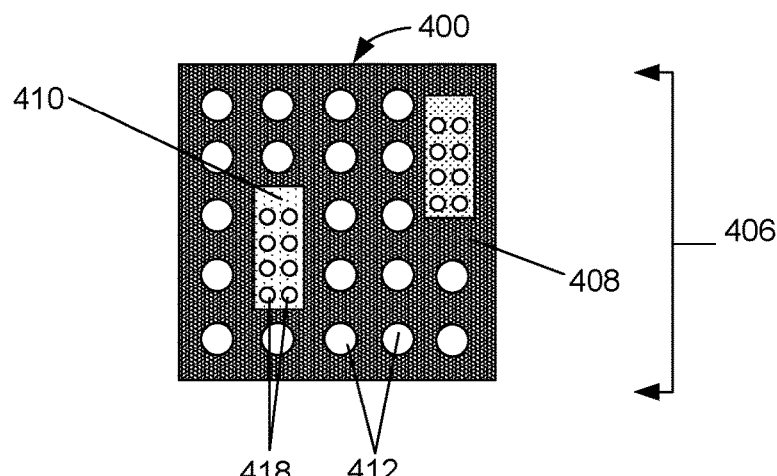
FIG. 5 illustrates a cutaway top-view of the example substrate of FIG. 4 taken along the 5-5 line shown in FIG. 4.

FIG. 4 illustrates a cross-sectional view of an example substrate 400 constructed in accordance with the teachings disclosed herein. FIG. 5 illustrates a cutaway top view of the example substrate 400 of FIG. 4 taken along the line 5-5 of FIG. 4. In the examples herein, the substrate 400 can be implemented as a package substrate in an IC package, such as the IC package 100 shown in FIG. 1. In other examples, the substrate 400 may be implemented on a circuit board such as a printed circuit board (PCB), for example. As shown in FIG. 4, the substrate 400 includes a top layer (e.g., a first build-up layer) 402 and a bottom layer (e.g., a second build-up layer) 404 disposed on either side of a substrate core 406. In the examples disclosed herein, the top and bottom layers 402, 404 are constructed in a substantially similar manner as the top and bottom layer 202, 204 of the substrate 200 of FIG. 2. However, unlike the core 206 of the substrate 200 of FIGS. 2 and 3, the core 406 of the example substrate 400 of FIGS. 4 and 5 includes different portions or regions associated with different materials. In some examples, the core 406 includes at least one region 408 constructed of an organic dielectric material (e.g., BT epoxy, etc.) substantially similar or identical to the core material of the core 206 of substrate 200 of FIG. 2 and at least one region 410 constructed of glass 410. For purposes of explanation, the region 408 that includes an organic material is sometimes referred to herein as an organic core region, an organic core, or an organic region. By contrast, the region 410 that includes glass is sometimes referred to herein as a glass core region, a glass core, or a glass region. In the particular example shown in FIGS. 4 and 5, there are two separate glass core regions 410 corresponding to isolated blocks of glass that are embedded within the core 406 of the substrate 400 that otherwise corresponds to a single continuous organic core region 408. Thus, in this example, a majority of the core 406 includes an organic dielectric material that completely surrounds isolated glass core regions 410 that contain glass. As shown in FIG. 4, the surface of the glass core 410 is substantially flush with the surface of the organic core 408 relative to the top and bottom layers 402, 404 of the substrate 400. As used herein, the term "substantially flush" refers to two surfaces being perfectly even (e.g., flat) in the same plane or slightly offset relative to each other but within a threshold value not exceeding two percent. In examples disclosed herein, the organic core region 408 is disposed adjacent to the glass core region 410 in a plane that extends parallel to the top and bottom layers 402, 404 of the substrate 400. In other examples, an alternate number of glass core regions 410 (e.g., only one or more than two) can be embedded within the organic region 408 of the core 406. Further, although both glass core regions 410 shown in FIG. 5 are the same size and have the same number and arrangement of example glass core vias 418, in other examples, the different glass core regions 410 can have different sizes, different shapes, and/or different arrangements and/or number of the vias.

As shown in FIG. 4, the example substrate 400 includes a set of plated through holes or vias 412 that extend through the organic core region 408 between the top layer and bottom layers 402, 404 of the substrate 400 in a substantially similar manner to the vias 208, 210, 212 of the substrate 200 described above in connection with FIG. 2. In some examples, the vias 412 define electrical paths extending through the substrate 400 in combination with corresponding contact pads 414, 416 at the top and bottom sides of the organic core region 408 and associated smaller vias 420, 422 within the top and bottom layers 402, 404 of the substrate 400 in a substantially similar manner to the contact pads 214, 216, 218, 220, 222, and 224 and smaller vias 226, 228, 230, 232, 234, and 236 as described above in connection with FIG. 2.

In examples disclosed herein, one or more additional vias 418 are disposed within the embedded glass core region 410 of the core 406. More particularly, as shown in the illustrated example, the vias 418 extend through the glass core 410 so as to electrically couple with a first and second contact pads 424, 426 located at the respective top and bottom sides of the glass core 410 and associated smaller vias 428, 430 within the respective top and bottom layers 402, 404 of the substrate 400. In some examples, the vias 418 extending through the glass core 410 are substantially parallel to the vias 412 extending through the organic core 408. As used herein, the term "substantially parallel" means perfectly parallel or parallel within 5 degrees of perfectly parallel. As shown in the illustrated example, the vias 418 within the embedded glass core region 410 (sometimes referred to herein as glass core vias) have a smaller diameter than the diameter of the vias 412 within the organic core material region 408 (sometimes referred to herein as organic core vias). In some examples, the glass core vias 418 are implemented as plated through holes in which the interior surface of the holes drilled within the embedded glass core region 410 are plated with conductive material (e.g., copper, etc.) without completely filling the holes.

Although a particular arrangement of the vias 412, 418 is shown in FIG. 5, the core 406 can include any suitable arrangement and/or number of organic core vias 412 in the organic core region 408 and any suitable arrangement and/or number of glass core vias 418 in the glass core regions 410. Furthermore, in some examples, the particular arrangement of the organic core vias 412 can differ relative to the size and positioning of the embedded glass core regions 410. Similarly, the particular arrangement of the glass core vias 418 within the glass core regions 410 can differ from one glass core region 410 to another based on the size and/or location of the glass core regions as well as the intended use of the associated glass core vias 418.

Figure 6:
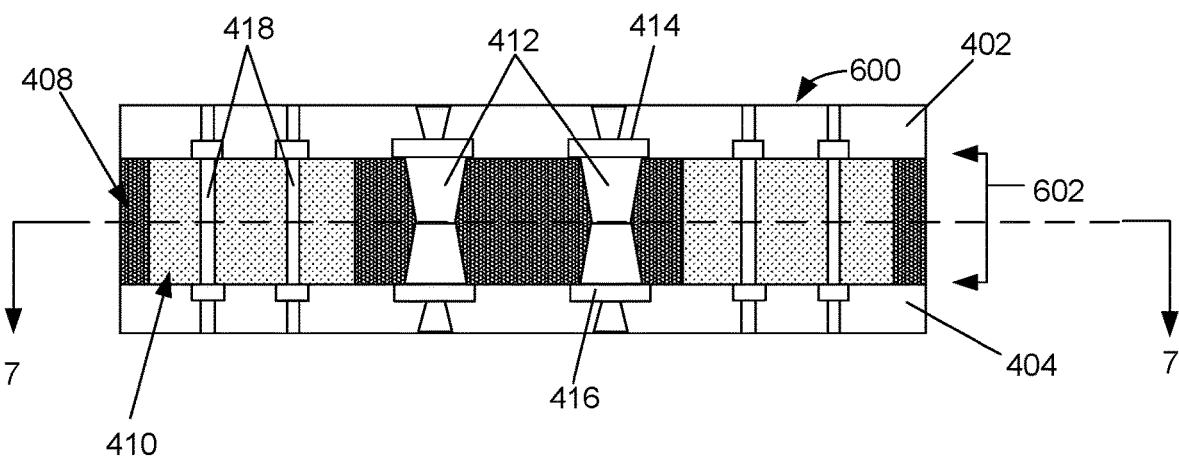
FIG. 6 illustrates a cross-sectional side-view of second example substrate constructed in accordance with teachings disclosed herein.
Figure 7:
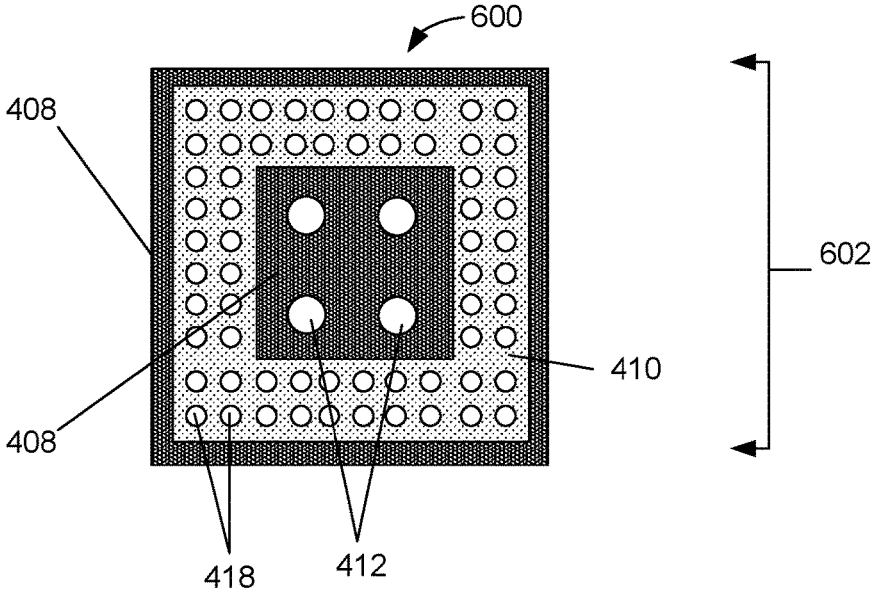
FIG. 7 illustrates a cutaway top-view of the example substrate of FIG. 6 taken along the 7-7 line shown in FIG. 6.

FIG. 6 illustrates a cross-sectional view of a second example substrate 600 constructed in accordance with the teachings disclosed herein. FIG. 7 illustrates a cutaway top view of the example substrate 600 of FIG. 6 taken along the line 7-7 of FIG. 6. The example substrate 600 of FIGS. 6 and 7 is constructed in a substantially similar manner as the substrate 400 of FIGS. 4 and 5. Accordingly, the same or like structures and features will be identified by the same or like reference numerals. As shown in FIG. 6, the substrate 600 includes an example core 602 in an alternate configuration relative to the core 406 of FIG. 4. The core 602 is disposed between the top and bottom layers 402, 404. The core 602 includes an organic core material region 408 and a glass core region (e.g., a glass block) 410. As shown in FIG. 6, the example substrate 600 includes a set of (e.g., two) plated through holes or vias 412 (e.g., organic core vias) that extend through the organic core region 408 in a substantially similar manner as the organic core vias 412 of the substrate 400 described above in connection with FIG. 4. Further, in the illustrated example, one or more glass core vias 418 are disposed within, and extend through, the embedded glass core region 410 of the core 602. In the examples disclosed herein, the vias 412, 418 of the substrate 600 include substantially similar contact pads 414, 416, 424, 426, respectively, as well as associated smaller vias 420, 422, 428, 430 within the top and bottom layers 402, 404, respectively, as described above in connection with FIG. 4.

As shown in FIG. 7, the glass core region 410 of the core 602 has a ring configuration, for example, including a plurality (e.g., five, ten, etc.) of vias 418 disposed throughout the glass core region 410. In some examples, the substrate 600 includes a region of organic core material 408 within the ring configuration of glass core 410 further including a plurality of vias 412 (e.g., two, four, etc.) extending through the region of organic core material 408. That is, in this example, the glass core region 410 circumscribes or completely surrounds and isolates at least a portion of the organic core 408. Further, as shown in FIG. 7, a separate portion of the organic core 408 circumscribes or completely surrounds the outer perimeter of the glass core 410 ring configuration. In other examples, the glass core region 410 may extend to an edge of the substrate 600 such that the glass core region 410 is not completely surrounded by the organic core region 408. In some examples, a majority of the core 602 corresponds to the glass core region 410. In some examples, the glass core region 410 can surround multiple distinct organic core regions 408 that are separated or isolated from one another by portions of the glass core region 410. As described above in connection with FIGS. 4 and 5, the particular size, positioning, and relationship of the organic core regions(s) 408 and the glass core region(s) 410 shown in FIGS. 6 and 7 are by way of example only. Any other suitable size, positions, relationships and/or other configuration of the regions 408, 410 may alternatively be implemented. Further, while the vias 412, 418 are shown in FIG. 7 to be arranged in substantially linear rows and columns, any other suitable arrangement of the vias 412, 418 may also be implemented (e.g., arranged in circles, ovals, in a staggered arrangement, in a single line, etc.). Further, the size, number, and/or spacing of the vias 412, 418 can be suitable adapted based on the particular size and location of the corresponding organic core regions 408 and glass core regions 410 as well as the intended use of particular ones of the vias 412, 418.

Figure 8:
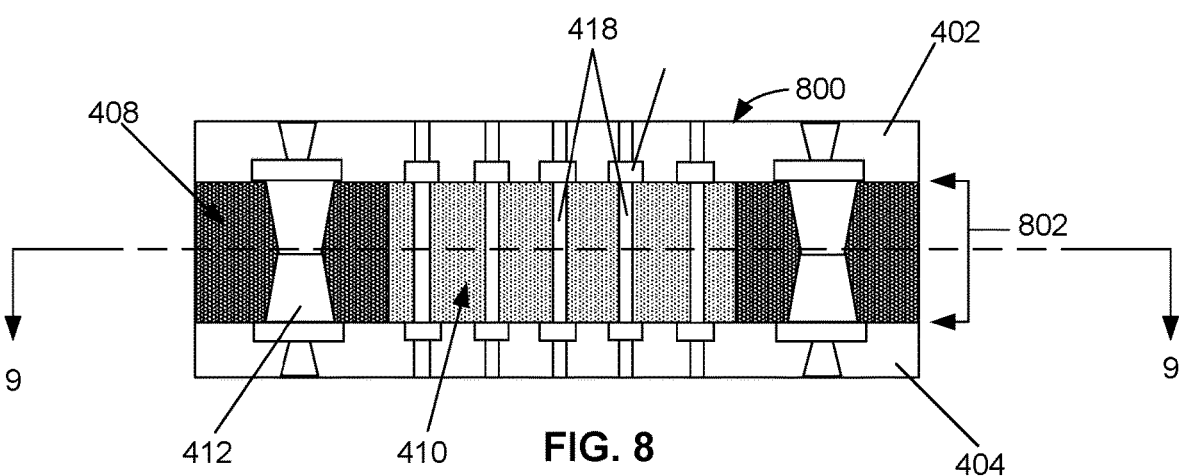
FIG. 8 illustrates a cross-sectional side-view of a third example substrate constructed in accordance with teachings disclosed herein.
Figure 9:
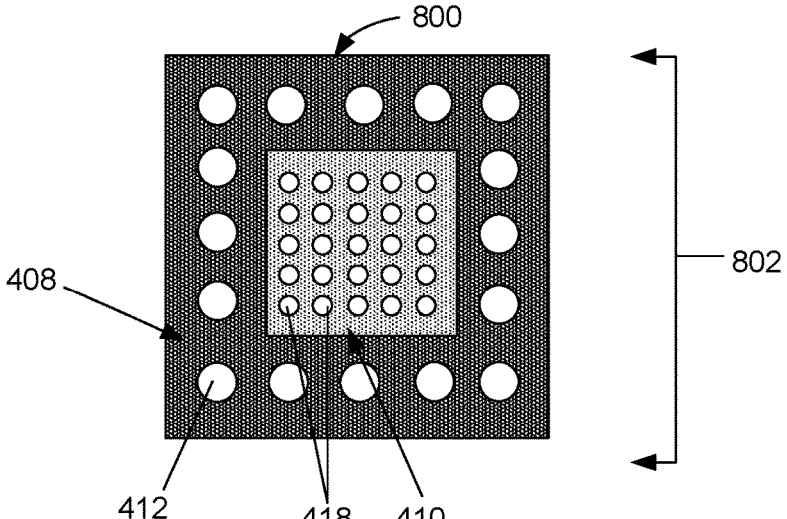
FIG. 9 illustrates a cutaway top-view of the example substrate of FIG. 8 taken along the 9-9 line shown in FIG. 8.

FIG. 8 illustrates a cross-sectional view of a third example substrate 800 constructed in accordance with teachings disclosed herein. FIG. 9 illustrates a cutaway top view of the example substrate 800 of FIG. 8 taken along the line 9-9 of FIG. 8. The example substrate 800 of FIGS. 8 and 9 is constructed in a substantially similar manner as the example substrates 400, 600 of FIGS. 4-7. Accordingly, the same or like structures and features will be identified by the same or like reference numerals. As shown in FIG. 8, the example substrate 800 includes an example core 802 disposed between the top and bottom layers 402, 404. The core 802 includes an organic core region 408 and a glass core region 410 embedded within the core 802 of the substrate 800. As shown in FIG. 8, substrate 800 includes a set of organic core vias 412 that are disposed within, and extend through, the organic core region 408 between the top layer and bottom layers 402, 404 of the substrate 800 in a substantially similar manner as described above in connection with FIGS. 4 and 5. Further, in this example, the core 802 of the substrate 800 includes glass core vias 418 extending through a single glass core region 410. In the examples disclosed herein, the vias 412, 418 of substrate 800 include substantially similar contact pads 414, 416, 424, 426, respectively, as well as associated smaller vias 420, 422, 428, 430, respectively, as substrate 400 of FIG. 4.

Figure 10:
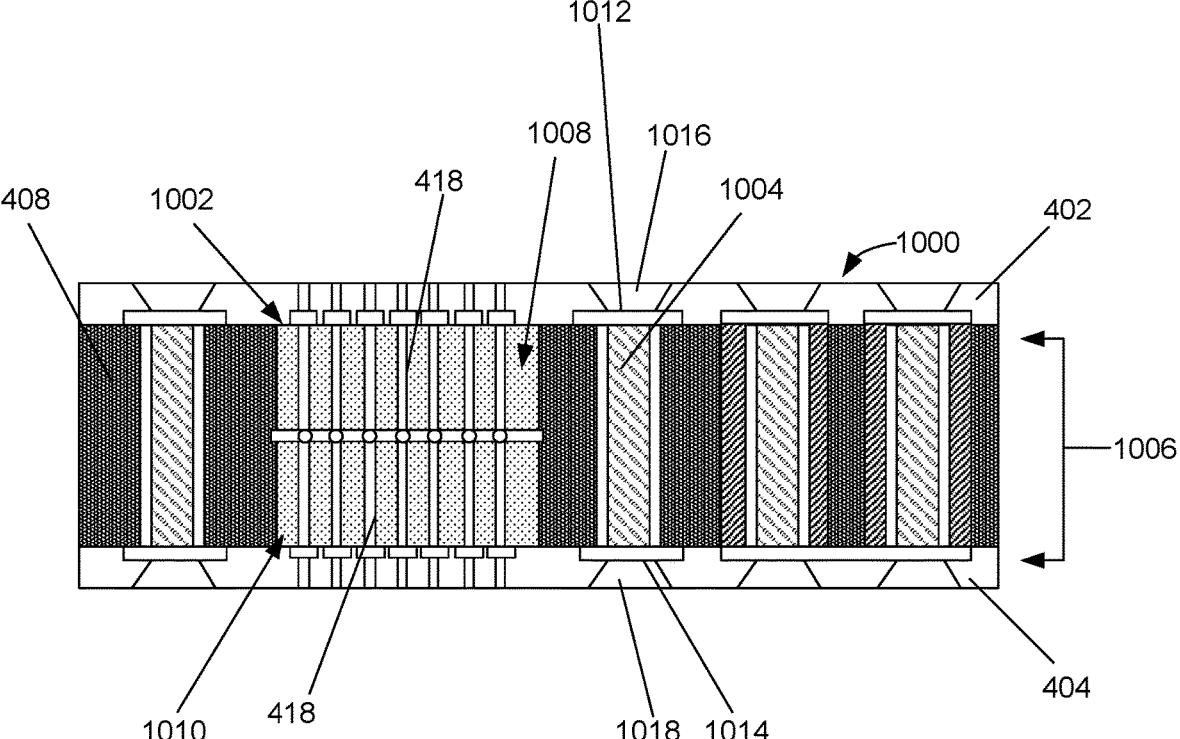
FIG. 10 illustrates a cross-sectional side-view of a fourth example substrate constructed in accordance with teachings disclosed herein.

FIG. 10 illustrates a cross-sectional view of a fourth example substrate 1000 constructed in accordance with teachings disclosed herein. In this example, the substrate 1000 includes an example stacked glass core region 1002 and a set of magnetic core inductors 1004 in an example core 1006 of the substrate 1000. As shown in FIG. 10, the glass core region 1002 is adjacent to the organic core region 408 within the substrate core 1006. In this example, the organic core region 408 includes the magnetic core inductors 1004, which are embedded within and extend through the organic core 408. As shown in FIG. 10, the magnetic core inductors 1004 are electrically coupled to corresponding contact pads 1012, 1014 at the top and bottom sides of the organic core region 408 and associated smaller vias 1016, 1018 within the top and bottom layers 402, 404 of the substrate 1000. The magnetic core inductors 1004 of the illustrated example are fabricated within the organic core region 408 in accordance with any suitable manufacturing techniques.

In the illustrated example of FIG. 10, the stacked glass core region 1002 of FIG. 10 includes a first block of layer of glass 1008 stacked on top of a second block or layer of glass 1010. In the examples disclosed herein, the combined thickness of the stacked first and second blocks or layers of glass 1008, 1010 between the top and bottom layers 402, 404 corresponds to a thickness of the organic core 408 between the top and bottom layers 402, 404. Limitations in manufacturing glass cores can limit the thickness of such glass cores. Accordingly, stacking layers of glass 1008, 1010 in the manner shown in the illustrated example enables the overall glass core region 1002 to be thicker than it otherwise would be if limited to a single layer of glass. Although two layers of glass 1008, 1010 are shown in FIG. 10. in other examples, more than two layers of glass can be stacked together to achieve any suitable thickness for the substrate core. In the illustrated example, each of the layers of glass 1008, 1010 include plated through holes or vias 418 (e.g., glass core vias) extending therethrough. Further, in this example, the glass core vias 418 in the first (e.g., top) layer of glass 1008 are aligned with the glass core vias 418 in the second (e.g., bottom) layer of glass 1010 to define electrical paths extending through the stacked glass core region 1002.

Figure 11:
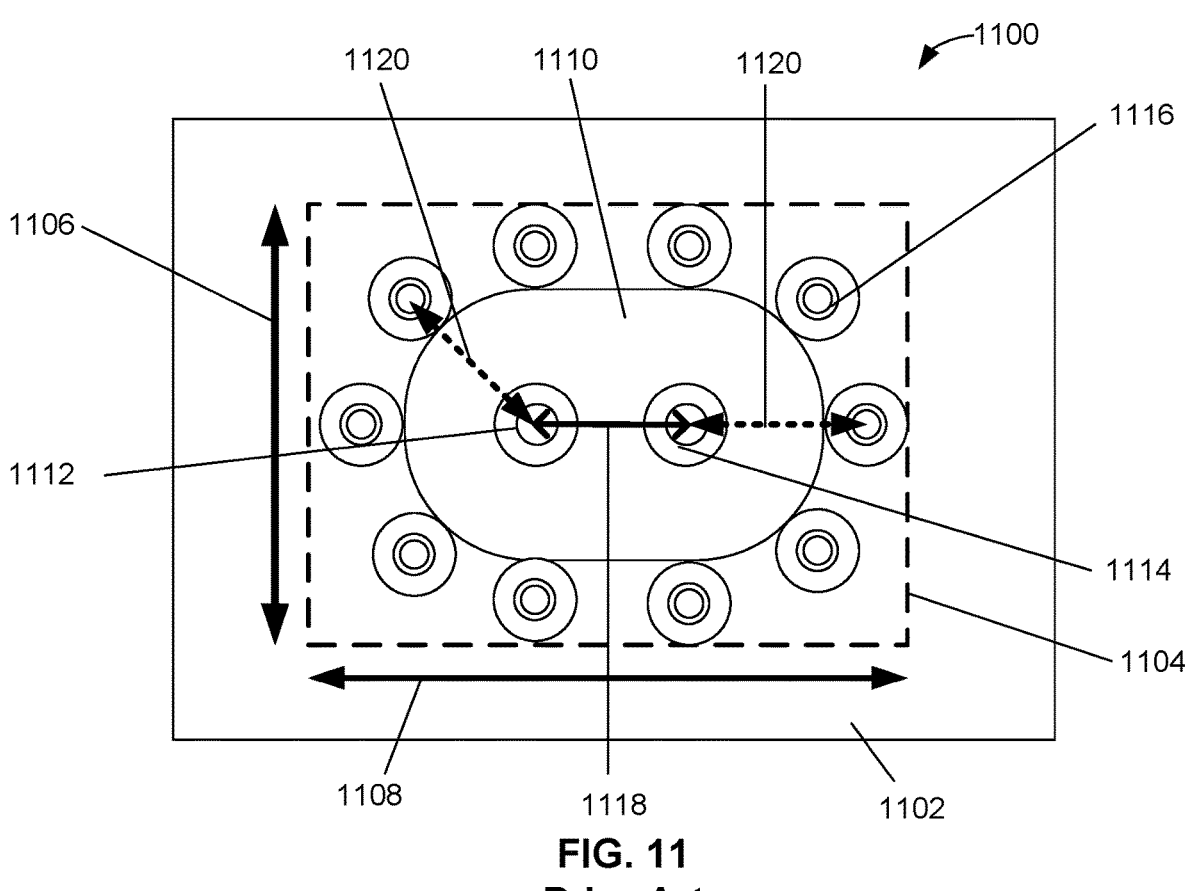
FIG. 11 illustrates a cutaway top-view of known configuration of plated through holes in an organic material core.

As mentioned above, the particular arrangement of the vias 412, 418 through the various example substrates 400, 600, 800, 1000 of FIGS. 4-10 are for purposes of illustration and not necessarily how the vias 412, 418 would be arranged in an actual substrate. By contrast, FIG. 11 illustrates a cutaway top-view of a known configuration of plated through holes or vias in a substrate 1100 with an organic core 1102. The organic core 1102 includes an area 1104 of plated through holes or vias embedded within the organic core 1102. As shown in FIG. 11, the area 1104 has a geometry defined by a first dimension 1106 and a second dimension 1108 associated outer limits of organic core vias within the area 1104. The organic core 1102 of the substrate 1100 includes a void area 1110 (e.g., empty space) of an ovular shape including organic core vias 1112, 1114 disposed within the void area 1110. In this instance, the organic core vias 1112, 1114 are signal pins that extend through the organic core 1102 to electrically couple with electrical components on opposites sides (e.g., top side and bottom side) of the core 1102. As shown in FIG. 11, the organic core 1102 also includes a set of additional organic core vias 1116 corresponding to ground pins disposed around the void area 1110 and the signal pins 1112. The ground pins 1116 extend through the organic core 1102 to electrically couple with a ground source. As shown in FIG. 11, the signal pins 1112, 1114 disposed in the void area 1110 are separated by a signal pitch 1118, or a distance between a center point of signal pin 1112 and signal pin 1114. Similarly, the set of ground pins 1116 are spaced at a signal to ground pitch 1120 defined as a distance from a center of each ground pin 1116 to a closest one of the signal pins 1112, 1114.

Figure 12:
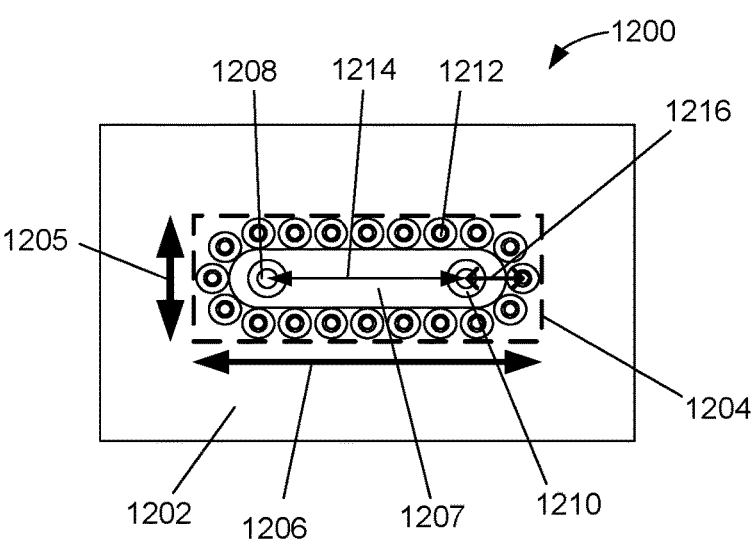
FIG. 12 illustrates a cutaway top-view of an example configuration of plated through holes in a glass core in accordance with teachings disclosed herein.

In contrast with the known configuration of plated through holes or via shown in FIG. 11, FIG. 12 illustrates a cutaway top-view of an example configuration of plated through holes or vias in a substrate 1200 with glass core 1202 constructed in accordance with teachings disclosed herein. In some examples, the glass core 1202 includes an area 1204 of plated through holes or vias embedded within the glass core region 1202. In the examples disclosed herein, the area 1204 of vias has a geometry defined by a first dimension 1205 and a second dimension 1206 associated with outer limits of the glass core vias within the area 1204. For purposes of comparison, FIGS. 11 and 12 are shown in a comparable scale. Thus, as shown by comparison of the two figures, both the first and second dimensions 1205, 1206 in FIG. 12 are significantly smaller (e.g., reduced by 80% and 65%, respectively) than the corresponding first and second dimensions 1106, 1108 of the area 1104 of FIG. 11.

Thus, it is possible to achieve a much higher signal density using a glass core (as shown in FIG. 12) than it is possible using an organic core (as shown in FIG. 11).

In the illustrated example of FIG. 12, the area 1204 takes a portion of the glass core 1202 whereas, in other examples, the area 1204 takes up the entire glass core 1202. As shown in FIG. 12, the area 1204 includes a void area 1207 (e.g., empty space) of an ovular shape in which two signal pins 1208, 1210 (e.g., glass core vias) are disposed extending through the glass core 1202. As shown in FIG. 12, a plurality of ground pins 1212 (e.g., glass core vias) are disposed surrounding the void area 1207. In some examples, the signal pins 1208, 1210 include a signal pitch 1214. In some examples, although the overall area 1204 in FIG. 12 is significantly smaller than the area 1104 of FIG. 11, the signal pitch 1214 extending between the signal pins 1208, 1210 in FIG. 12 is equal to or greater than the signal pitch 1118 between the signal pins 1112, 1114 in FIG. 11. In some examples, a signal to ground pitch 1216 defines the distance between a signal pin 1208, 1210 and a closest ground pin 1212. As shown by comparison of FIGS. 11 and 12, the signal to ground pitch 1216 in FIG. 12, corresponding to glass core vias, is significantly smaller than the signal to ground pitch 1120 in FIG. 11, corresponding to organic core vias. In some examples, the diameter of the signal pins 1208, 1210 and/or the ground pins 1212 within the glass core 1202 of FIG. 10 is smaller compared to the diameter of the signal and ground pins 1112, 1114, 1116 within the organic core 1102 of FIG. 11. As such, as shown by FIG. 12 a larger quantity of ground pins 1212 can be placed around the void area 1207 of the glass core 1202.

Figure 13:
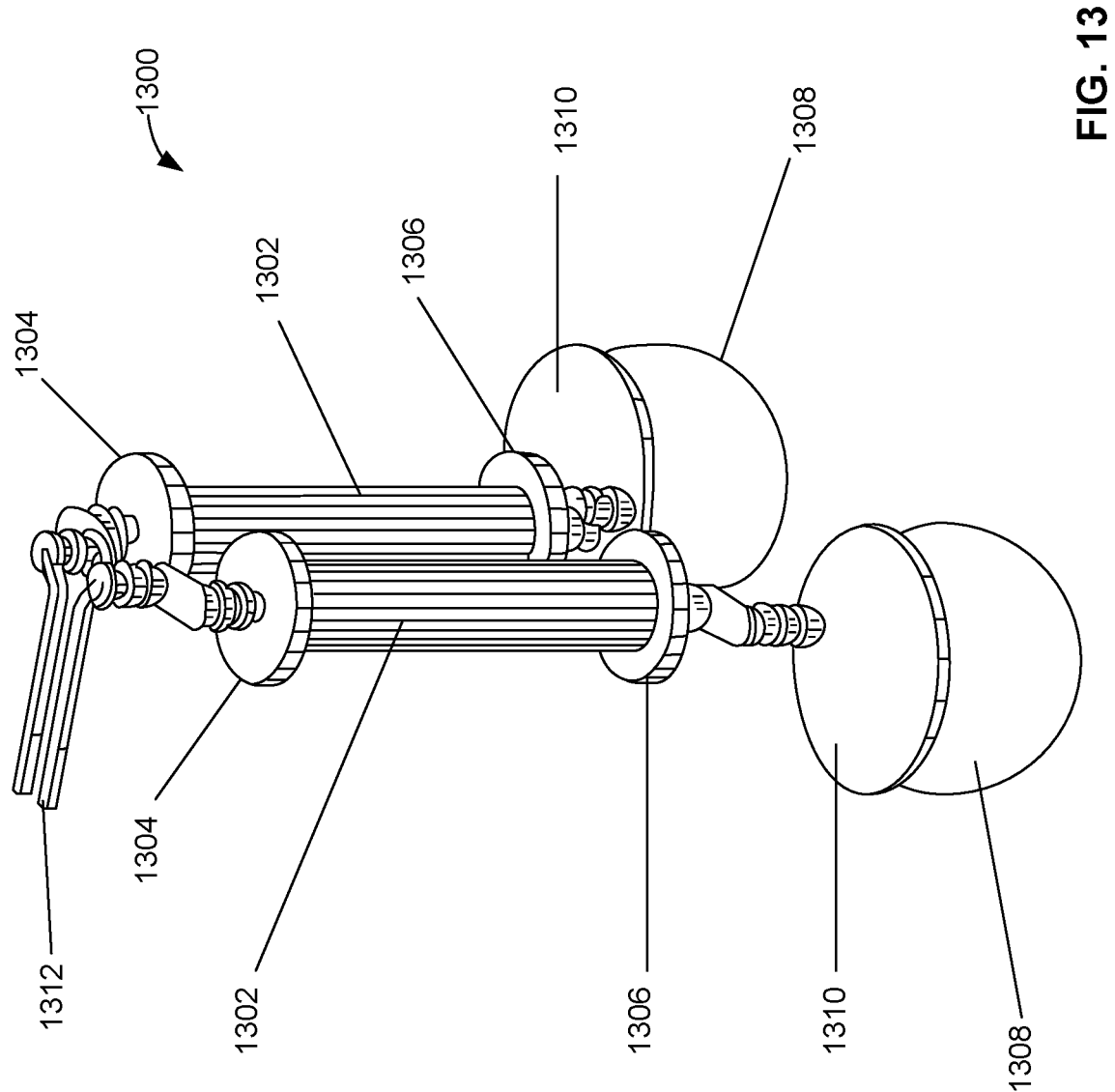
FIG. 13 illustrates a perspective view of an example set of vias that may be implemented in the glass core of any one of the example substrates of FIGS. 4-10.

FIG. 13 illustrates a perspective view of an example set of glass core vias 1302 that may be implemented in the glass core of any one of the example substrates of FIGS. 4-10. However, in the illustrated example of FIG. 13, the glass core is omitted for purposes of explanation. In some examples, the glass core vias 1302 extend through the glass core to electrically couple with a top contact pad 1304 on a top surface of a glass core (e.g., comparable to the contact pad 414 of FIG. 4) and with a bottom contact pad 1306 on a bottom surface of a substrate (e.g., comparable to the contact pad 416 of FIG. 4). As shown in FIG. 13, a portion of a ball grid array is shown with a ball (e.g., a solder ball) 1308 disposed on a contact pad 1310 representing a second level interconnect between a substrate (e.g., a package substrate) and a circuit board. As represented in FIG. 13, the glass core vias 1302 enable the electrical connection of the balls 1308 at a bottom surface of a substrate containing the glass core with metal interconnects or traces 1312 at a top surface of the substrate.

Figure 14:
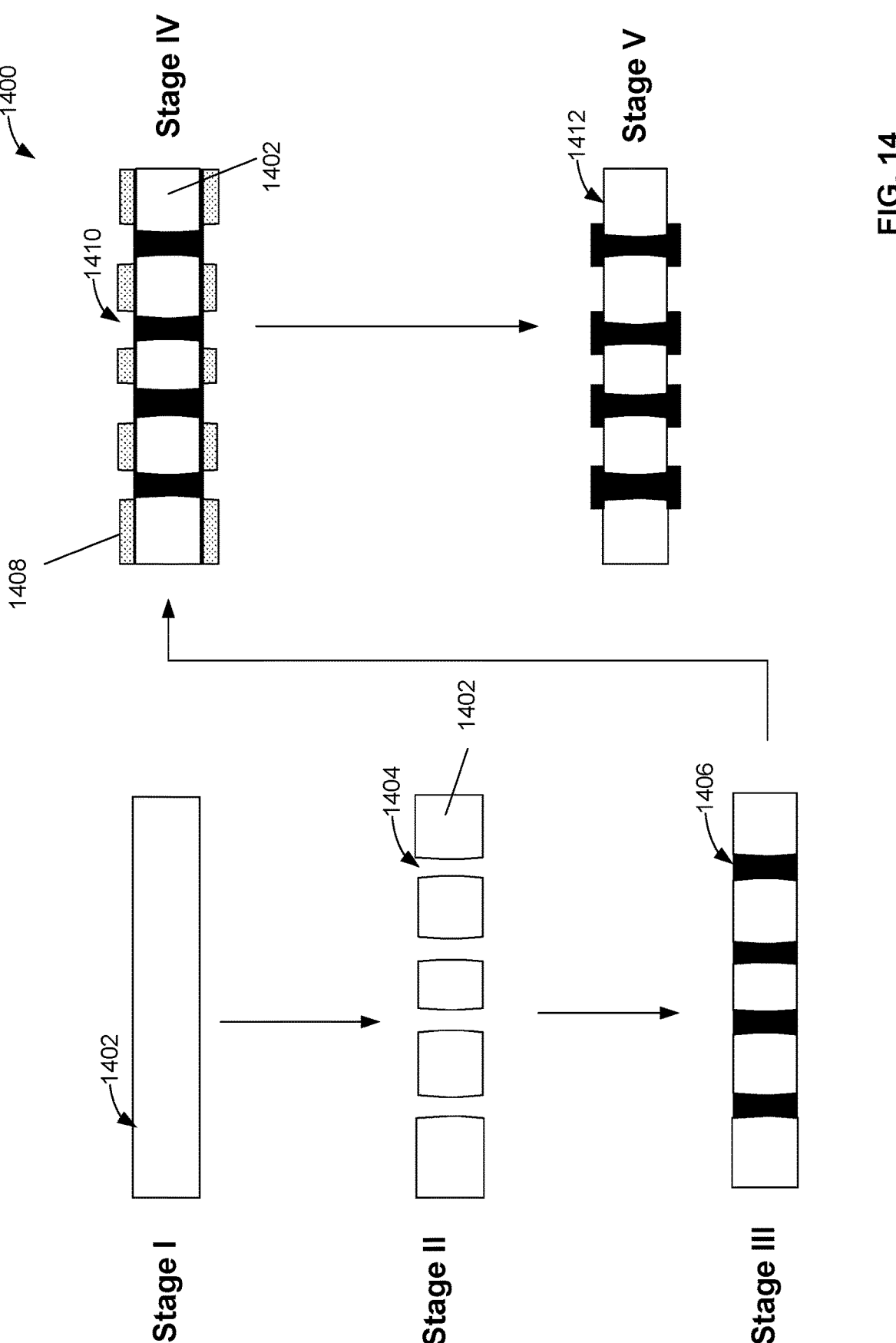
FIG. 14 illustrates stages in an example process flow to manufacture a glass core in accordance with teachings disclosed herein.

FIG. 14 illustrates stages in an example process flow 1400 to manufacture a glass core in accordance with teachings disclosed herein. As shown by the process 1400, at Stage I, the glass core 1402 first begins as solid piece of glass. At Stage II, one or more through holes 1404 are drilled, or laser-cut through the glass core 1402. At Stage III, the through holes are plated and/or filled with a conductive material such as copper to provide glass core vias 1406. At Stage IV, a resist film 1408 is applied to the top and bottom surfaces of the glass core 1402 and patterned to form opening 1410 in the resist film 1408 aligned with the glass core vias 1406. At Stage V, the conductive material (e.g., copper) is deposited within the openings to provide the contact pads electrically coupled to the vias 1406 on either side of the glass core 1402. Further, Stage V shows the final core 1412 after removal of the resist film 1408.

Figure 15:
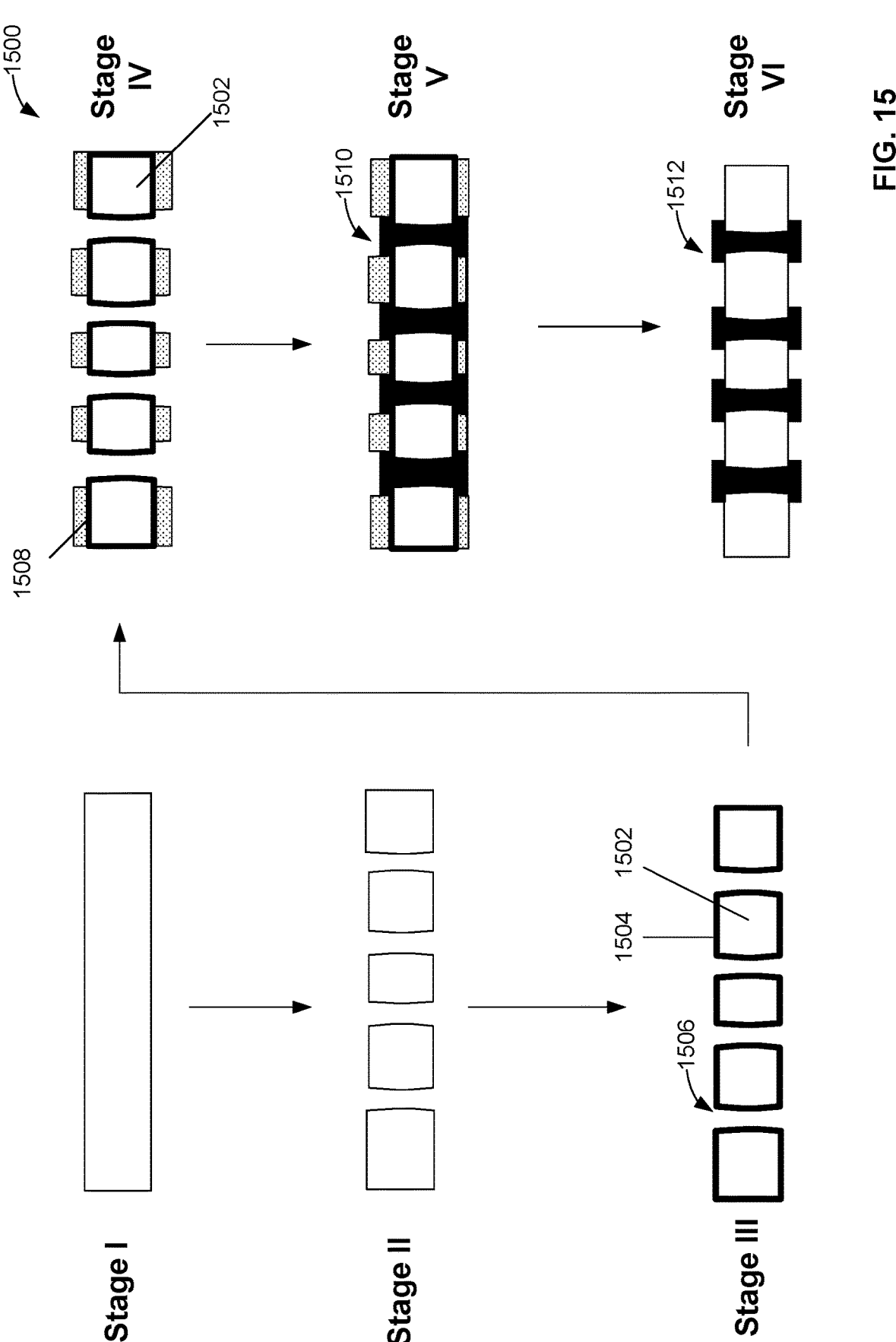
FIG. 15 illustrates stages in an alternative example process flow to manufacture a glass core in accordance with teachings disclosed herein.

FIG. 15 illustrates stages in an alternative example process flow 1500 to manufacture a glass core in accordance with teachings disclosed herein. Stages I and II in FIG. 15 are identical to Stages I and II described above in connection with FIG. 14. However, the example process flow 1500 of FIG. 15 differs from FIG. 14 at Stage III where the exposed surfaces of the glass core 1502 are plated with a conductive material 1504 (e.g., copper), including the surfaces within through holes 1506. At Stage IV, a resist film 1508 is deposited and patterned on the top and bottom surfaces of the glass core 1502. At Stage V, the through holes 1506 and the openings in the resist film 1508 are filled with a conductive material (e.g., copper) to create both the glass core vias and the corresponding contact pads on the opposites sides of the glass core 1502. A final glass core 1512 is shown at Stage VI after the resist film 1508 has been removed.

Figure 16:
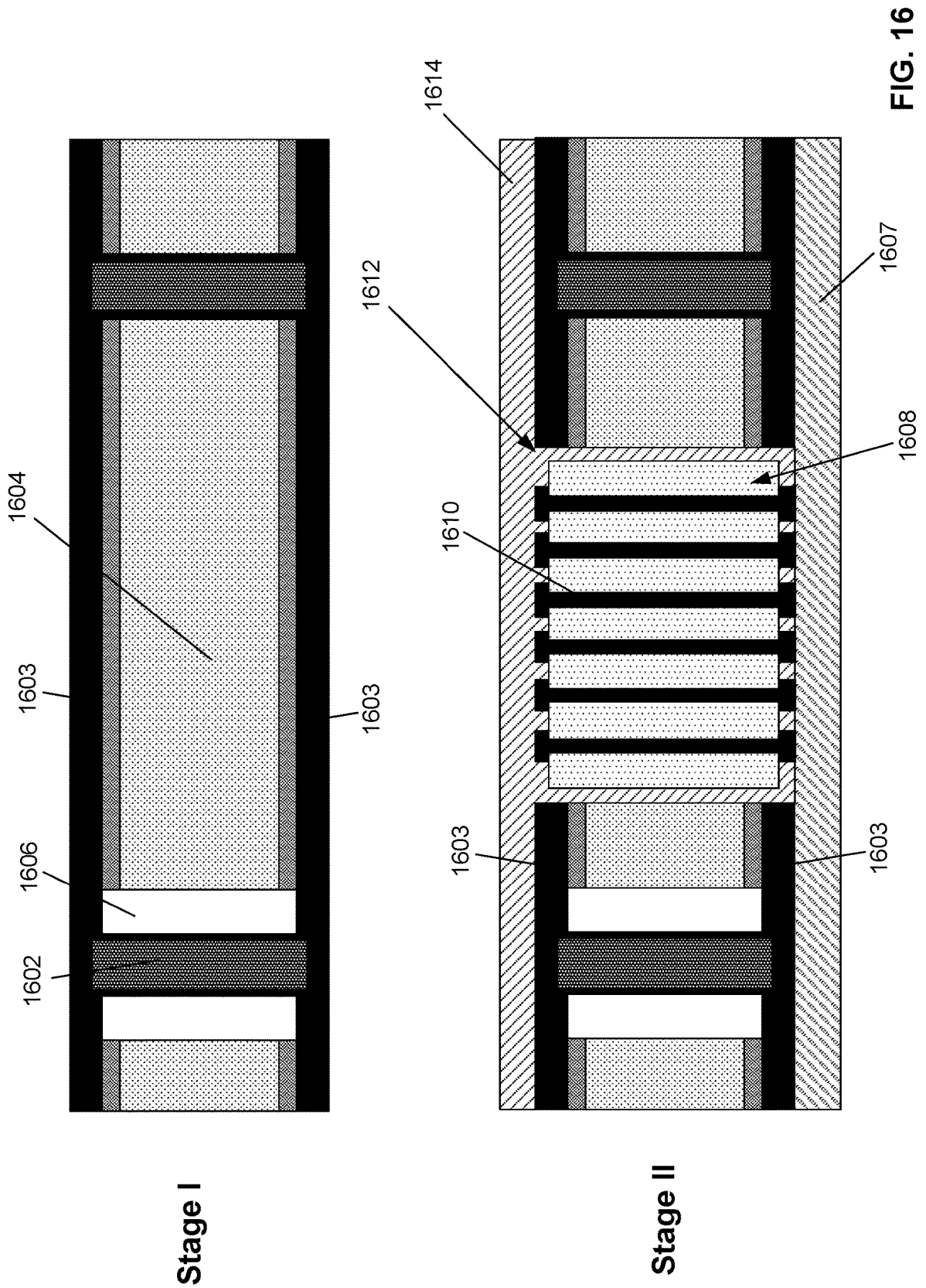
FIGS. 16-17 illustrate stages in an example process flow to manufacture the example substrate of any one of FIGS. 4-10 in accordance with teachings disclosed herein.
Figure 17:
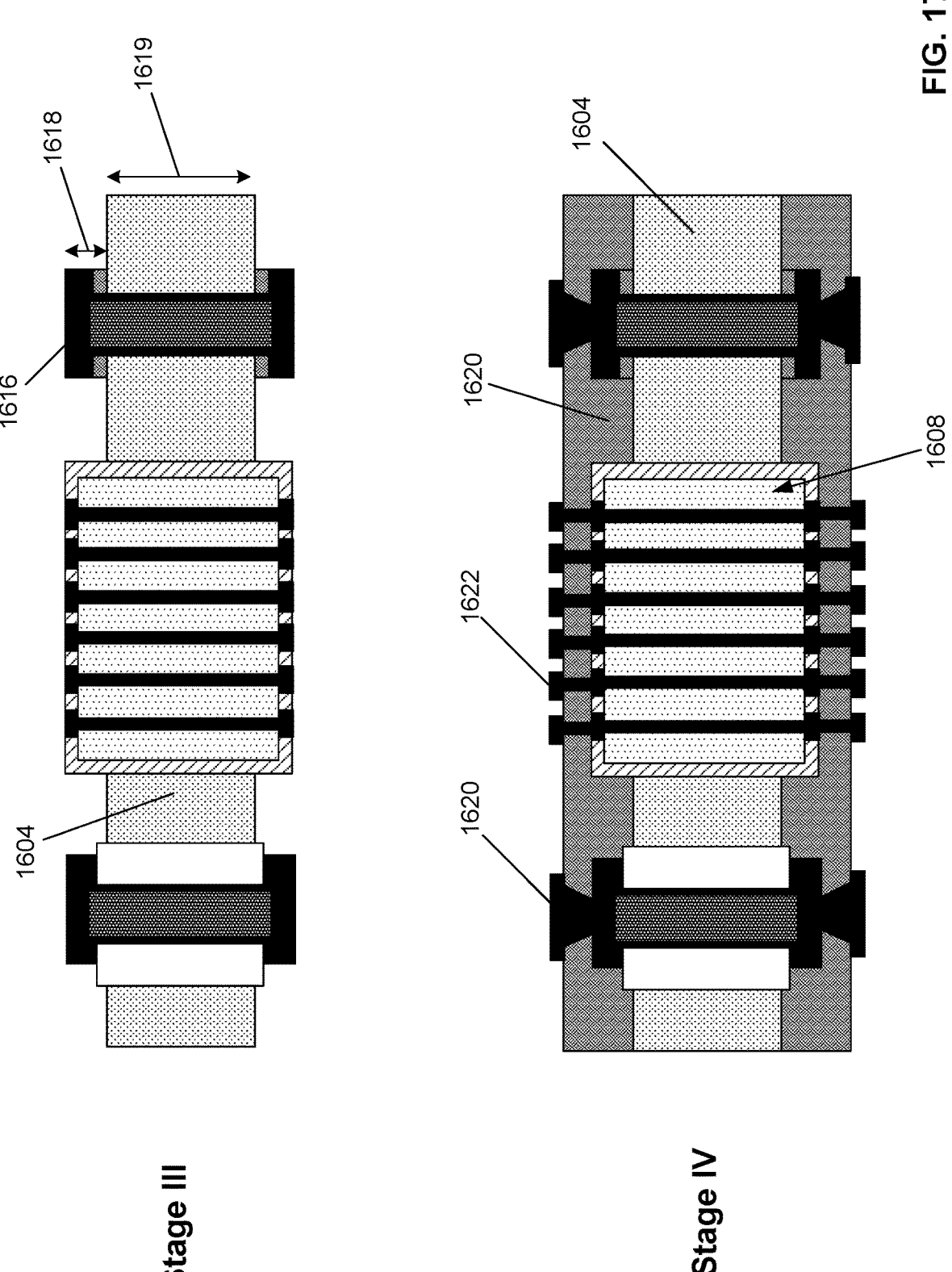

FIGS. 16-17 illustrate stages in an example process flow to manufacture any one of the example substrates 400, 600, 800, 1000 of FIGS. 4-10. As shown at Stage I, an organic core 1604 has already been provided with a magnetic core inductor 1602 included therein. In some examples, magnetic material 1606 is first added into an opening within the organic core 1604. A through hole may then be drilled through the magnetic material 1606 that is subsequently plugged and covered with one or more layers of copper 1603 as represented in FIG. 16. Stage II of FIG. 16 represents a point in the process flow after a cavity 1612 is provided (e.g., through a drilling process) in the organic core 1604. In some examples, the cavity 1612 extends completely through the organic core as well as the layers of copper 1603. Further, Stage II represents the placement of a glass core 1608 within the cavity 1612. In some examples, the glass core 1608 is fabricated in accordance with the example process flows 1400, 1500 of FIG. 14 or 15. Thus, as shown in the illustrated example, the glass core 1608 already includes a plurality of glass core vias 1610 extending therethrough with contact pads at either end of the vias 1610. In some examples, the glass core 1608 is positioned within the cavity 1612 within the organic core 1604 with a carrier 1607 to which the glass core 1608 is temporarily attached. Once the glass core 1608 is positioned within the cavity 1612, an encapsulation material 1614 is deposited to fill in any open spaces with the cavity thereby encasing the glass core 1608. At Stage III (FIG. 17), the carrier 1607 is detached and the excess encapsulation material 1614 is removed (e.g., via grinding). Further, excess materials from the top and bottom surfaces of the organic core 1604 are also removed (e.g., via etching) except around the organic core vias (e.g., the magnetic core inductor 1602) to define associated contact areas or pads 1616. In some examples, the contact pads 1616 have a height 1618 of approximately 30 micrometers. In some examples, the glass core 1608 has a height 1619 of approximately 1,000 micrometers. At Stage IV, the organic core 1604 (along with the organic core vias extending therethrough) as well as the glass core 1608 are encapsulated by a dielectric laminate 1620. Thereafter, openings are created (e.g., drilled) in the dielectric laminate 1620 and subsequently filled with conductive material to define vias 1622 that electrically couple the vias extending through the substrate with contact pads on the exterior surface of the substrate.

Figure 18:
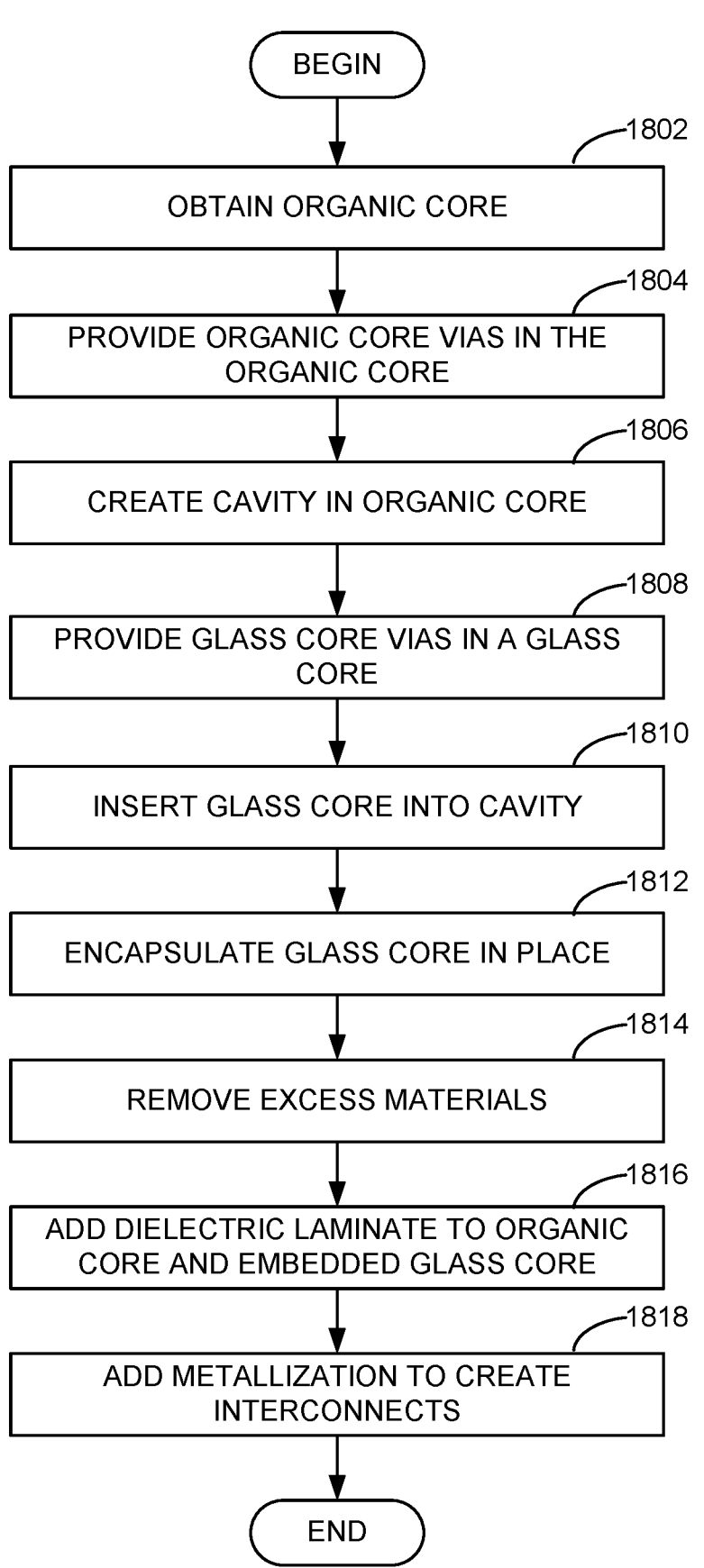
FIG. 18 is an example method of manufacturing the example substrate of any one of FIGS. 4-10 in accordance with the example process flows of FIGS. 14-17.

FIG. 18 is an example method of manufacturing any one of the example substrates 400, 600, 800, 1000 of FIGS. 4-10 in accordance with the example process flows of FIGS. 14-17. In some examples, some or all of the operations outlined in the example method are performed automatically by fabrication equipment that is programmed to perform the operations. Although the example method of manufacture is described with reference to the flowchart illustrated in FIG. 18, many other methods may alternatively be used. For example, the order of execution of the blocks may be changed, and/or some of the blocks described may be combined, divided, re-arranged, omitted, eliminated, and/or implemented in any other way.

The example method begins at block 1802 by obtaining an organic core. At block 1804, one or more organic core vias are provided in the organic core. At block 1806, a cavity is created in the organic core. At block 1808, glass core vias are provided in a glass core. At block 1810, the glass core is inserted into the cavity of the organic core. At block 1812, the glass core is encapsulated in place. At block 1814, excess material(s) are removed. At block 1816, a dielectric laminate is added to the organic core and the embedded glass core. At block 1818, metallization is added to create interconnects to provide electrical signal path between opposite surfaces of the substrate through the organic core vias and the glass core vias.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

Example embedded glass cores in package substrates and related methods are disclosed herein. Further examples and combinations thereof include the following:

Example 1 includes an integrated circuit comprising a substrate having a first side and a second side opposite the first side, a plurality of vias disposed within the substrate to electrically couple corresponding contacts on the first and second sides of the substrate, a glass core surrounding a first via of the plurality of vias, and an organic core surrounding a second via of the plurality of vias, the second via different than the first via.

Example 2 includes the integrated circuit of example 1, wherein the glass core has a first surface and a second surface opposite the first surface, and the organic core has a first surface and a second surface opposite the first surface, the first via extending through the glass core between the first surface of the glass core and the second surface of the glass core, the second via extending through the organic core between the first surface of the organic core and the second surface of the organic core, the first surface of the glass core substantially flush with the first surface of the organic core, the second surface of the glass core substantially flush with the second surface of the organic core.

Example 3 includes the integrated circuit of examples 1 and 2, wherein the organic core is adjacent to the glass core in a plane extending parallel to the first and second sides of the substrate.

Example 4 includes the integrated circuit of examples 1-3, wherein the glass core is a first glass core region embedded within the organic core, the integrated circuit further including a second glass core region embedded within the organic core, the first glass core region distinct and spaced apart from the second glass core region, the second glass core region surrounding a third via of the plurality of vias.

Example 5 includes the integrated circuit of examples 1-4, wherein the organic core completely surrounds the organic core in a plane extending parallel to the first and second sides of the substrate.

Example 6 includes the integrated circuit of examples 1-5, wherein the glass core completely surrounds the organic core in a plane extending parallel to the first and second sides of the substrate.

Example 7 includes the integrated circuit of examples 1-6, wherein the first via has a first diameter and the second via has a second diameter, the first diameter smaller than the second diameter.

Example 8 includes the integrated circuit of examples 1-7, wherein a first subset of vias extend through the glass core and a second subset of vias extend through the organic core, the first subset of vias including the first via, the second subset of vias including the second via, the first subset of vias spaced apart by a first pitch, the second subset of vias spaced apart by a second pitch, the first pitch smaller than the second pitch.

Example 9 includes the integrated circuit of examples 1-8, wherein the second via is a magnetic core inductor.

Example 10 includes the integrated circuit of examples 1-9, wherein the glass core includes a plurality of layers of glass stacked together.

Example 11 includes the integrated circuit of example 10, wherein a combined thickness of the stacked layers of glass corresponding to a thickness of the organic core.

Example 12 includes an apparatus comprising a substrate to support a die, a first via extending through a first region of a core of the substrate, the first region of the core including glass, and a second via extending through a second region of the core of the substrate different than the first region, the second region of the core including an organic material.

Example 13 includes the apparatus of example 12, wherein the first region is adjacent a second region such that the first via is substantially parallel to the second via.

Example 14 includes the apparatus of examples 12 and 13, wherein the first region surrounds the second region.

Example 15 includes the apparatus of examples 12-14, wherein the second region surrounds the first region.

Example 16 includes the apparatus of examples 12-15, further including a third via extending through a third region of the core, the third region including glass, the first region separated from the third region by a portion of the organic material.

Example 17 includes the apparatus of examples 12-16, wherein the first region includes a first block of glass and a second block of glass, the first block of glass stacked on the second block of glass.

Example 18 includes the apparatus of examples 12-17, wherein the second via corresponds to a magnetic core inductor.

Example 19 includes a method for manufacturing a substrate for an integrated circuit package, the method comprising providing a first via through an organic core, creating a cavity within an organic core, the cavity spaced apart from the first via, and inserting a glass core within the cavity, the glass core including a second via extending therethrough.

Example 20 includes the method of example 19, wherein the cavity extends through a full thickness of the organic core.

Example 21 includes the method of examples 19 and 20, wherein the cavity surrounds a portion of the organic core such that the glass core surrounds the portion of the organic core once inserted within the cavity.

Example 22 includes the method of examples 19-21, wherein the cavity corresponds to a hole within the organic core such that the organic core surrounds the glass core once inserted within the cavity.

Example 23 includes the method of examples 19-22, wherein the cavity is a first cavity, and the glass core is a first glass core, the method further including creating a second cavity within the organic core and inserting a second glass core within the second cavity, the second glass core spaced apart from the first glass core by a portion of the organic core.

The following claims are hereby incorporated into this Detailed Description by this reference, with each claim standing on its own as a separate embodiment of the present disclosure.

What is claimed is:

1. An integrated circuit package comprising:
a substrate having a first side and a second side opposite the first side;
a plurality of vias within the substrate to electrically couple corresponding contacts on the first and second sides of the substrate;
a glass core surrounding a first via of the plurality of vias, the glass core defining an exterior wall of the first via; and an organic core surrounding a second via of the plurality of vias, the second via different than the first via, the organic core and the glass core in a same plane, the plane substantially parallel to and between the first and second sides of the substrate.

2. The integrated circuit package of claim 1, wherein the glass core has a first surface and a second surface opposite the first surface, and the organic core has a first surface and a second surface opposite the first surface, the first via extending through the glass core between the first surface of the glass core and the second surface of the glass core, the second via extending through the organic core between the first surface of the organic core and the second surface of the organic core, the first surface of the glass core substantially flush with the first surface of the organic core, the second surface of the glass core substantially flush with the second surface of the organic core.

3. The integrated circuit package of claim 1, wherein the organic core is adjacent to the glass core in the plane.

4. The integrated circuit package of claim 1, wherein the glass core is a first glass core region within the organic core, the integrated circuit package including a second glass core region within the organic core, the first glass core region distinct and spaced apart from the second glass core region, the second glass core region surrounding a third via of the plurality of vias.

5. The integrated circuit package of claim 1, wherein the organic core completely surrounds the glass core in the plane.

6. The integrated circuit package of claim 1, wherein the glass core completely surrounds the organic core in the plane.

7. The integrated circuit package of claim 1, wherein the first via has a first diameter and the second via has a second diameter, the first diameter smaller than the second diameter.

8. The integrated circuit package of claim 1, wherein a first subset of vias extend through the glass core and a second subset of vias extend through the organic core, the first subset of vias including the first via, the second subset of vias including the second via, the first subset of vias spaced apart by a first pitch, the second subset of vias spaced apart by a second pitch, the first pitch smaller than the second pitch.

9. The integrated circuit package of claim 1, wherein the second via is a magnetic core inductor.

10. The integrated circuit package of claim 1, wherein the glass core includes a plurality-stack of layers of glass.

11. The integrated circuit package of claim 10, wherein a combined thickness of the stacked layers of glass corresponds to a thickness of the organic core.

12. An apparatus comprising:

a substrate having a first side and a second side opposite the first side;

a plurality of vias within the substrate to electrically couple corresponding contacts on the first and second sides of the substrate;

a glass core surrounding a first via of the plurality of vias, the glass core defining an exterior wall of the first via; and an organic core surrounding a second via of the plurality of vias, the second via different than the first via, a first end of the first via closer to the first side of the substrate than a second end of the first via is to the first side of the substrate, a first end of the second via closer to the first side of the substrate than a second end of the second via is to the first side of the substrate, the first end of the first via closer to the first end of the second via than the second end of the first via is to the first end of the second via.

13. The apparatus of claim 12, wherein the first via is substantially parallel to the second via.

14. The apparatus of claim 12, wherein the organic core surrounds the glass core.

15. The apparatus of claim 12, wherein the glass core surrounds the organic core.

16. The apparatus of claim 12, wherein the glass core corresponds to a first solid piece of glass, the apparatus including a third via extending through a second solid piece of glass, the first piece of glass separated from the second piece of glass by a portion of the organic core.

17. The apparatus of claim 12, wherein the glass core includes a first block of glass and a second block of glass, the first block of glass stacked on the second block of glass.

18. The apparatus of claim 12, wherein the second via corresponds to a magnetic core inductor.

19. An integrated circuit package comprising:

a substrate having a first side and a second side opposite the first side;

a plurality of vias within the substrate to electrically couple corresponding contacts on the first and second sides of the substrate;

a glass core surrounding a first via of the plurality of vias, the glass core defining an exterior wall of the first via; and an organic core surrounding a second via of the plurality of vias, the second via different than the first via, the organic core surrounding the glass core along a plane transverse to and passing through a longitudinal length of the first via.

20. The integrated circuit package of claim 19, wherein the glass core is a first region of glass, the integrated circuit package including a second region of glass surrounding a third via of the plurality of vias, the second region of glass separated from the first region of glass by a portion of the organic core.

21. The integrated circuit package of claim 20, wherein the organic core surrounds the second region of glass along the plane transverse to and passing through the longitudinal length of the first via.

22. The integrated circuit package of claim 19, wherein the first via has a first diameter and the second via has a second diameter larger than the first diameter.

23. The integrated circuit package of claim 19, wherein the first via is one of a first subset of vias in the glass core, and the second via is one of a second subset of vias in the organic core, different ones of the first subset of vias spaced apart by a first pitch, different ones of the second subset of vias spaced apart by a second pitch greater than the first pitch.

* * * * *